US006091350A

United States Patent [19]

Paulos et al.

[11] Patent Number: 6,091,350

[45] Date of Patent: Jul. 18, 2000

[54] AUTOMATIC VOLTAGE REFERENCE SCALING IN ANALOG-TO-DIGITAL AND DIGITAL-TO-ANALOG CONVERTERS

[76] Inventors: John J. Paulos, 7922 Jester Blvd., Austin, Tex. 78750; Scott T. Dupuie, 9208-B Sedgemoor Tr., Austin, Tex. 78748

[21] Appl. No.: 08/678,608

[22] Filed: Jul. 15, 1996

Related U.S. Application Data

[63] Continuation of application No. 08/212,977, Mar. 15, 1994, abandoned.

[51] Int. Cl.[7] .......... H03M 1/00

[52] U.S. Cl. .......... 341/139; 341/155; 341/144

[58] Field of Search .......... 341/139, 126, 341/127, 128, 129, 166, 167, 144

[56] References Cited

U.S. PATENT DOCUMENTS 4,121,205 10/1978 Iga et al. .......... 341/144
4,908,623 3/1990 Ullestad .......... 341/167

OTHER PUBLICATIONS

Brokaw, A.P., "A Monolithic 10–Bit A/D Using I$^2$L and LWT Thin–Film Resistors," IEEE J. Solid–State Circuits, vol. SC–13, pp. 736–745, Dec. 1978.

Kelson, G., et al., "A Monolithic 10–b Digital–to–Analog Converter Using Ion Implantation," IEEE J. Solid–State Circuits, vol. SC–8, pp. 396–403, Dec. 1973.

Hamade, A.R., "A Single Chip All–MOS 8–Bit A/D Converter," IEEE J. Solid–State Circuits, vol. SC–8, pp. 396–403, Dec. 1973.

Inose, H., et al, "A Telemetry System by Code Modulation—Delta–Sigma Modulation," IRE Trans. Space Electron. Telemetry, vol. SET–8, pp. 204–209, Sep. 1962.

Naus, P.J.A., et al., "A CMOS Stereo 16–Bit D/A Converter for Digital Audio," IEEE J. Solid–State Circuits, vol. SC–22, pp. 390–395, Jun. 1987.

*Primary Examiner*—Brian K. Young

[57] ABSTRACT

Analog-to-digital and digital-to-analog converters are described which have internal reference voltage generators. These voltage generators include circuitry which senses the magnitude of the power supply voltage applied to the chip. The internal reference voltage generators then select one of two internal reference voltages as a reference voltage for the conversion operations depending on the magnitude of the power supply voltage.

37 Claims, 3 Drawing Sheets

AUTOMATIC VOLTAGE REFERENCE SCALING IN ANALOG-TO-DIGITAL AND DIGITAL-TO-ANALOG CONVERTERS

REFERENCE TO RELATED APPLICATION

This is a continuation of application Ser. No. 08/212,977, filed on Mar. 15, 1994, abandoned.

Reference is made to a related application entitled CONFIGURATION PROGRAMMING OF A DIGITAL AUDIO SERIAL PORT USING NO ADDITIONAL PINS, Ser. No. 08/212,978, filed Mar. 15, 1994, now U.S. Pat. No. 5,594,442, filed Mar. 15, 1994 in the name of Paulos, John J., Kamath, Gautham D., and Krone, Andrew W. and which is hereby incorporated by reference. This application describes and claims apparatus for adding additional operating options to a chip without increasing the pin count of the chip.

TECHNICAL FIELD

The present invention relates to analog-to-digital and digital-to-analog converters, and more particularly, to internal reference voltages used in such converters.

BACKGROUND OF THE INVENTION

An analog-to-digital converter is a circuit which converts a physical analog signal (continuous in value and continuous in time) to a digital signal (discrete in value and discrete in time) which is suited for use in a digital computer. A digital-to-analog converter performs the reverse process of converting a digital signal into a physical analog signal. Most commonly, the analog signals of interest are voltage waveforms which might be received from an electromechanical transducer, such as a microphone, or used to drive an electromechanical transducer, such as a loudspeaker. The digital signal is a series of numeric values which correspond to samples of the voltage waveform taken at discrete points in time. These numeric values may correspond directly to a physical voltage, in units of volts, or they may be in arbitrary units.

Most commonly, analog-to-digital and digital-to-analog converters are ratiometric, meaning that the digital output, in the case of an analog- to-digital converter, or the digital input, in the case of a digital-to-analog converter, corresponds to some fraction of an arbitrary reference voltage. For example, an analog-to-digital converter for digital audio applications might produce a 16-bit, 2's complement digital signal where a positive full scale digital output corresponds to an input of +2 V, and a negative full scale output corresponds to an input of −2 V. In many commercial parts, the reference level for the analog-to-digital or digital-to-analog conversion is determined by an on-chip voltage reference circuit. Ideally, the voltage reference circuitry will produce a reference level which is precise, stable with temperature, and independent of the actual power supply voltage seen by the part. In other commercial parts, the voltage reference is provided by the user on an external pin. In many applications this is undesirable as the user is forced to generate a precise voltage reference using additional components.

Ratiometric converters which use either an external voltage reference, or which divide down the power supply for use as the reference, do have one advantage over converters with internal voltage references in that they can be readily designed to operate effectively over a wide range of power supply voltages. For example, one might design a converter which can operate with a total supply voltage of anywhere from 10 V to 30 V, and where the external voltage reference can be scaled with the power supply to make effective use of the available supply voltage. So, a user might operate the converter with supply voltages of +5 V and −5 V, with an external voltage reference of 3 V (realizing a conversion range of −3 V to +3 V). Or, a user could operate the converter with supply voltages of +15 V and −15 V, with an external voltage reference of 10 V, thereby realizing a conversion range of −10 V to +10 V. In contrast, given a fixed, internal voltage reference of 3 V, the same part would always provide a conversion range of −3 V to +3 V, independent of supply voltage.

It can therefore be appreciated that an analog-to-digital converter or digital-to-analog converter with an internal reference voltage which can operate with a multiplicity of supply voltage is desirable.

SUMMARY OF THE INVENTION

An object of the present invention is to provide a means by which an analog-to-digital or digital-to-analog converter can operate at a multiplicity of supply voltages with a multiplicity of internally generated reference voltages.

Shown in an illustrated embodiment of the invention is a converter in which the internally generated voltage reference is based on the measured supply voltage.

The automatic sensing of power supply voltage described above can also be used to switch the common-mode level in single supply converters. In single supply designs, the analog input range, for an analog-to-digital converter, or analog output range, for a digital-to-analog converter, is restricted to either a positive range of values between 0V and some positive supply, or a negative range of values between 0V and some negative supply. In such a case, the common-mode level, or center line, of the analog range must be increased along with the reference voltage in order to maintain an analog range which is roughly centered between 0V and the supply voltage. This adjustment in the common-mode level can also be based on the measured power supply voltage.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
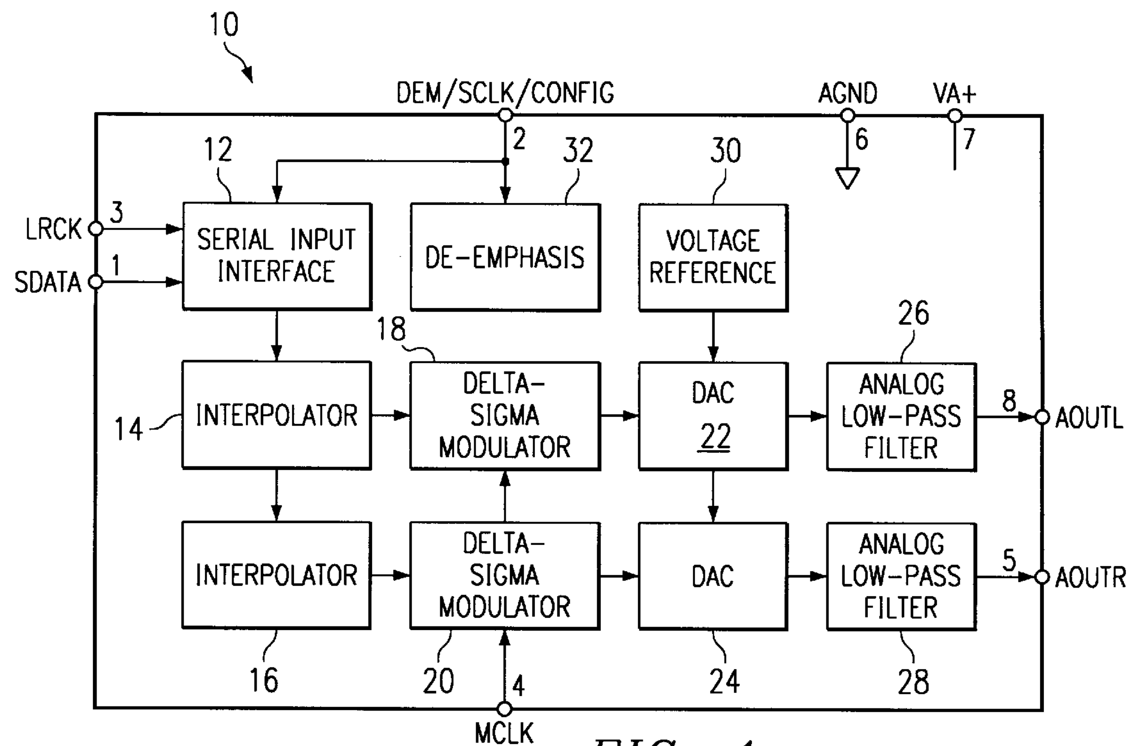
FIG. 1 is a block diagram of a digital-to-analog converter according to the present invention.

It will be appreciated that for purposes of clarity and where deemed appropriate reference numerals have been repeated in the figures to indicate corresponding features.

DESCRIPTION OF THE PREFERRED EMBODIMENT

The preferred embodiment of the invention is a low cost, stereo delta-sigma digital-to-analog converter intended for digital audio applications. A block diagram 10 for this part is shown in FIG. 1, including pin assignments for an 8-pin package. The part provides two channels of digital-to-analog conversion with either 16 or 18-bit input data. The part includes a serial interface 12 for stereo input data, two interpolation filters 14 and 16, two digital delta-sigma modulators 18 and 20 which produce 1-bit data streams for two 1-bit digital-to-analog converters (DACs) 22 and 24, two analog low-pass filters 26 and 28 which use switched-capacitor techniques, and an on-chip voltage reference 30. A de-emphasis circuit 32 receives a de-emphasis signal. The interpolation filters 14 and 16 are switchable, and can produce either a flat response or a de-emphasis response as required for Compact Disk (CD) applications. The part is designed to operate from a multiplicity of master clock frequencies (256x, 384x, and 512x times the digital audio sampling rate), and can support a multiplicity of serial data formats. The digital-to-analog converter 10 operates from a single supply voltage VA+ between 2.7 V and 5.5 V.

Figure 2:
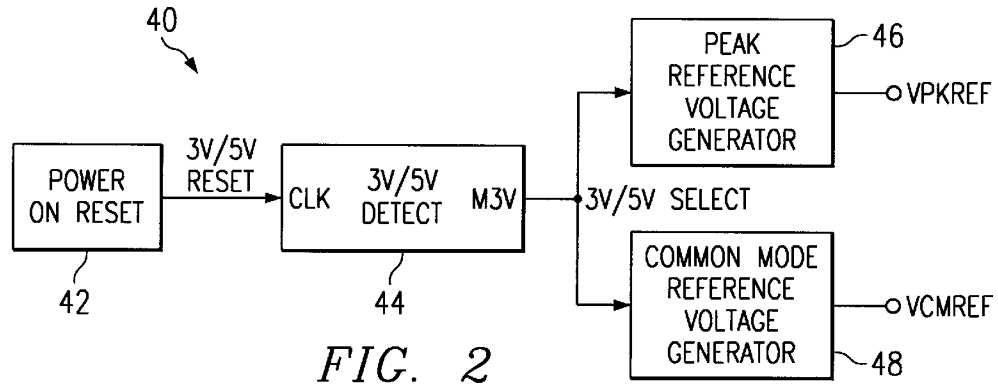
FIG. 2 is a block diagram of an automatic supply voltage sensing circuit for use in the digital-to-analog converter of FIG. 1.

Several steps have been taken in the digital-to-analog converter 10 to achieve the maximum flexibility with a limited number of pins. One such feature is the automatic supply sensing used in the present invention. A block diagram 40 of the preferred embodiment, which is contained within the Voltage Reference block 30, of this function is shown in FIG. 2. The Power On Reset circuit 42 generates a 3 V/5 V RESET signal when power is applied. The 3 V/5 V RESET signal configures a 3 V/5 V Detect circuit 44 which, in turn, configures two reference voltage generator circuits, a Peak Reference Voltage Generator circuit 46 and a Common Mode Reference Voltage Generator Circuit 48, for 3 V operation (VA+ between 2.7 V and 4.5 V). In this configuration, the voltage reference produces an on-chip peak reference voltage of 2.0 V and a common-mode reference voltage of 1.3 V, resulting in an analog output range of 0.3–2.3 V (for a full-scale conversion range of 2.0 V peak-to-peak). After some delay, which allows both the Voltage Reference circuit 30 and the power supply (not shown) to settle to their final values, the 3 V/5 V Detect circuit 44 is enabled. If the power supply, VA+, is high enough to support operation with a 4 V peak reference voltage (greater than 4.5 V), the 3 V/5 V Select signal will cause the Voltage Reference circuit 30 to be reconfigured in the 5 V mode, producing a peak reference voltage of 4.0 V and a common-mode reference voltage of 2.3 V, resulting in an analog output range of 0.3–4.3 V (for a full-scale conversion range of 4.0 V peak-to-peak).

Figure 3:
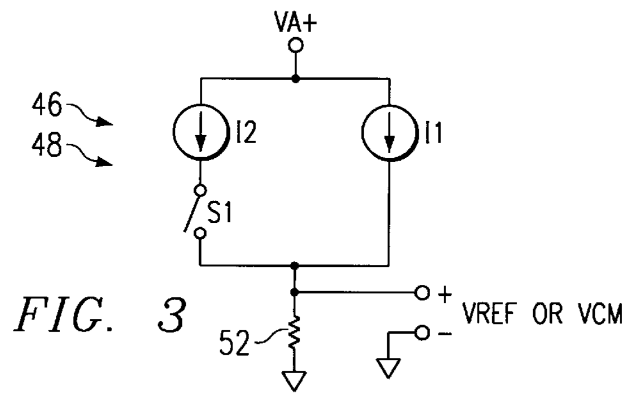
FIG. 3 is a schematic diagram of a switchable voltage reference circuit for use in the digital-to-analog converter of FIG. 1.

A simplified schematic of the switchable Peak Voltage Reference Generator circuit 46 and the Common Mode Voltage Reference Generator circuit 48 is shown in FIG. 3. Two current sources I1 and I2 are used to generate the reference voltage across a resistor 52, as shown. In 3 V mode, only current source I1 is used (switch S1 open). In 5 V mode, both current sources I1 and I2 are used (switch S1 closed). As will be understood by those skilled in the art, the resistor 52 is a different resistance in the Peak Reference Voltage Generator circuit 46 as compared to the Common Mode Reference Voltage Generator circuit 48.

Figure 4:
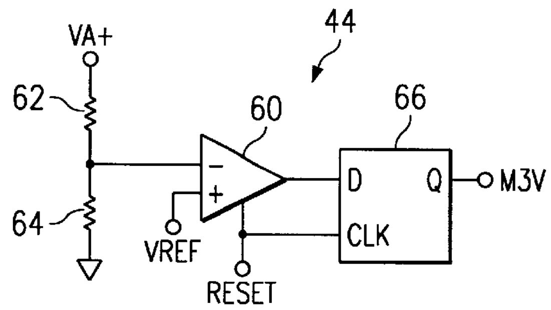
FIG. 4 is a block diagram of a 3 V/5 V detect circuit which can be used in the digital-to-analog converter of FIG. 1.

A block diagram of the 3 V/5 V Detect circuit 44 is shown in FIG. 4. A comparator 60 is used to compare the reference voltage VREF (in 3 V mode) to a fraction of the power supply (VA+) as set by the resistor divider of resistors 62 and 64. The comparator 60 is turned on by the RESET signal, and the comparator 60 output is latched on the falling edge of the RESET pulse by the D latch 66. If the reference voltage remains larger than the divided supply voltage, the comparator result is true (logical'1') and the Peak Reference Voltage Generator circuit 46 and the Common Mode Voltage Reference Generator circuit 48 remain in the 3 V mode. Otherwise, the Peak Voltage Reference Generator circuit 46 and the Common Mode Reference Voltage Generator circuit 48 will be switched to the 5 V mode.

Figure 5:
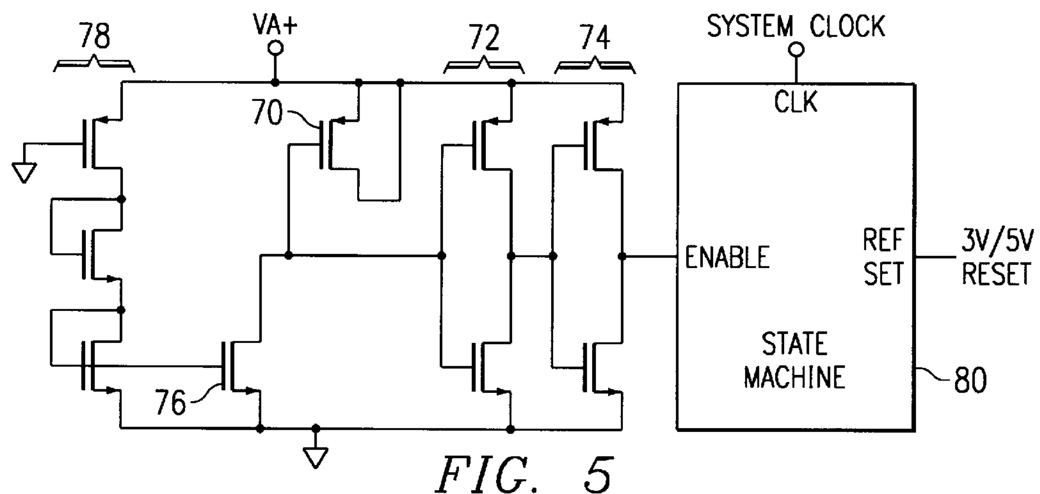
FIG. 5 is a schematic diagram of the preferred embodiment of the Power On Reset circuit shown in FIG. 2.

A schematic diagram of the Power On Reset circuit 42 is shown in FIG. 5. When VA+ is applied to the chip, transistor 70, configured to operate as a capacitor, holds the input to the first of two inverter stages 72 and 74 at a high voltage level which in turn causes the enable input of a state machine 80 to be high. After a period of time transistor 76 is able to charge the transistor-capacitor 70 and the enable input falls. The state machine 80, which is well known to those skilled in the art, provides a single positive pulse when power is first applied to the chip. The system clock is used to provide the 3 V/5 V RESET with a predetermined width by detecting the fall of the enable input, and then counting for a predetermined count until pulling the 3 V/5 V RESET signal low. The width of the 3 V/5 V RESET pulse is designed so that the power supply voltage and the comparator 60 settle to their final values. The respective sizes of the transistor-capacitor 70, the transistor 76, and the transistors in the bias circuit 78 are selected so that the state machine 80 and system clock are stable before the enable input to the state machine 80 goes low.

Figure 6:
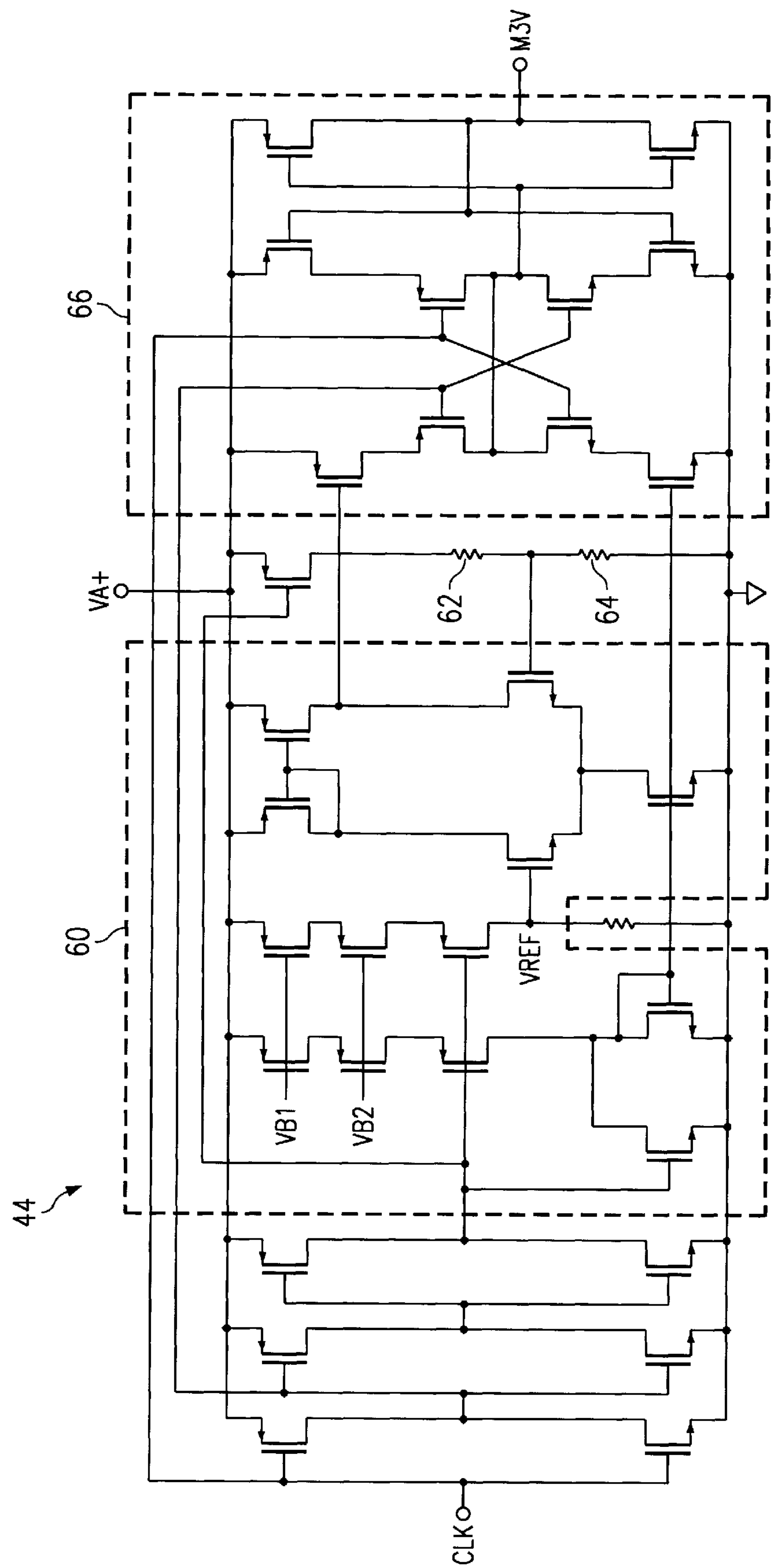
FIG. 6 is a schematic diagram of the 3 V/5 V detect circuit of FIG. 4.

A detailed schematic of the 3 V/5 V Detect circuit 44 is shown in FIG. 6. The 3 V/5 V RESET signal is applied to the clk input of the 3 V/5 V Detect circuit 44. When the 3 V/5 V RESET signal is high, the comparator circuit 60 is enabled, while the D latch 66 initially provides a high logic signal indicative of 3 volt operation at the M3 V output. During the time that the 3 V/5 V RESET signal is high, the comparator output is coupled to the output of the D latch 66. When the RESET signal falls, the output of the comparator 60 is first latched by the D latch 66, and then the power to the comparator is removed to conserve chip power. The voltages VB1 and VB2 are bias voltages, and circuitry for generating these bias voltages is well known in the art.

The present invention is also applicable to a data conversion chip which receives both positive and negative supply voltages. In this type of circuit, the resistor 64 in FIG. 4 is connected to the negative supply voltage instead of to ground. The Common Mode Reference Voltage Generator circuit 48 is not used since the common mode voltage stays at ground potential for any size of the supply voltages.

Figure 7:
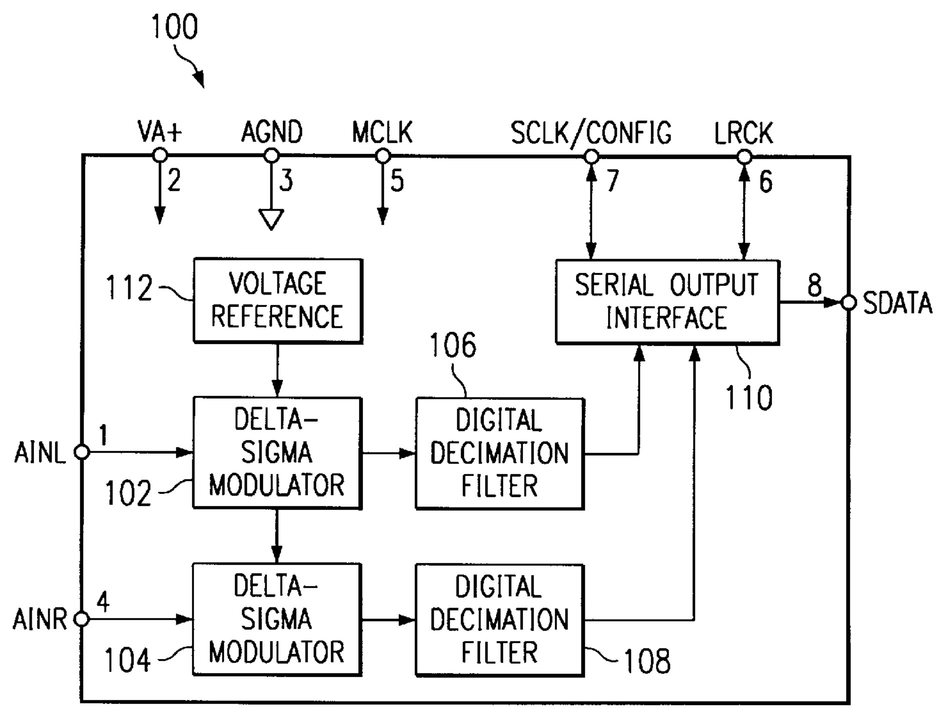
FIG. 7 is a block diagram of a analog-to-digital converter according to the present invention.

An alternative embodiment of the invention is a low cost, stereo delta-sigma analog-to-digital converter intended for digital audio applications. A block diagram 100 for this part is shown in FIG. 7, including pin assignments for an 8-pin package. The part provides two channels of analog-to-digital conversion with either 16 or 18-bit input data. The part includes two analog delta-sigma modulators 102 and 104 which produce 1-bit data streams for two decimation filters 106 and 108, a serial interface 110, and an on-chip voltage reference 112. This analog-to-digital part is similar to the digital-to-analog part shown in FIG. 1, and is designed to operate from a multiplicity of master clock frequencies (256x, 384x, and 512x times the digital audio sampling rate), and can support a multiplicity of serial data formats. The analog-to-digital converter 100 operates from a single supply voltage VA+ between 2.7 V and 5.5 V.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

What is claimed is:

1. A delta-sigma digital-to-analog converter having a peak internal reference voltage generator and a common mode internal reference voltage generator wherein said peak and common mode internal reference voltage generators each select from one of a plurality of voltages, the said one of a plurality of voltages being selected by said digital-to-analog converter in response to a power supply voltage applied to the digital-to-analog converter.

2. A digital-to-analog converter having an internal reference voltage wherein said internal reference voltage is selected from one of a plurality of voltages, the said one of a plurality of voltages being selected by said digital-to-analog converter in response to a power supply voltage applied to the digital-to-analog converter.

3. A digital-to-analog converter having an internal reference voltage and a first supply voltage input terminal, said digital-to-analog converter comprising:

a) a power supply sensing circuit coupled to said first power supply input terminal, said power supply sensing circuit having an output indicative of one of a plurality of voltage ranges received at said first supply voltage input terminal;

b) a reference voltage generator circuit coupled to said power supply sensing circuit, said reference voltage generator circuit having an output which is said internal reference voltage wherein the magnitude of said internal reference voltage is one of a plurality of reference voltages, each of said plurality of reference voltages corresponding to one of each of said plurality of voltage ranges received at said first supply voltage input terminal.

4. The digital-to-analog converter set forth in claim 3 wherein said power supply sensing circuit further includes:

a) a power on reset circuit for detecting when power is applied to said digital-to-analog converter and for providing a reset signal; and b) a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit.

5. The digital-to-analog converter set forth in claim 3 wherein said plurality of voltage ranges is two voltage ranges.

6. The digital-to-analog converter set forth in claim 3 further including a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit, and wherein said voltage detection circuit, after said detection, holds the detected output signal constant until another reset signal is received.

7. The digital-to-analog converter set forth in claim 3 wherein said internal reference voltage is a peak reference voltage.

8. The digital-to-analog converter set forth in claim 3 wherein said internal reference voltage is a common mode reference voltage.

9. The digital-to-analog converter set forth in claim 7 and further including a common mode reference voltage generator circuit coupled to said power supply sensing circuit, said common mode reference voltage generator circuit having an output which is a common mode reference voltage wherein the magnitude of said common mode reference voltage is one of a plurality of common mode reference voltages, each of said plurality of common mode reference voltages corresponding to one of each of said plurality of voltage ranges received at said first supply voltage input terminal.

10. A digital-to-analog converter having an internal reference voltage and positive and negative supply voltage input terminals, said digital-to-analog converter comprising:

a) a power supply sensing circuit coupled to said positive and negative power supply input terminals, said power supply sensing circuit having an output indicative of one of a plurality of voltage ranges received at said positive and negative supply voltage input terminals;

b) a reference voltage generator circuit coupled to said power supply sensing circuit, said reference voltage generator circuit having an output which is said internal reference voltage wherein the magnitude of said internal reference voltage is one of a plurality of reference voltages, each of said plurality of reference voltages corresponding to one of each of said plurality of voltage ranges received at said positive and negative supply voltage input terminals.

11. The digital-to-analog converter set forth in claim 10 wherein said power supply sensing circuit further includes:

a) a power on reset circuit for detecting when power is applied to said digital-to-analog converter and for providing a reset signal; and b) a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit.

12. The digital-to-analog converter set forth in claim 10 wherein said plurality of voltage ranges is two voltage ranges.

13. The digital-to-analog converter set forth in claim 10 further including a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit, and wherein said voltage detection circuit, after said detection, holds the detected output signal constant until another reset signal is received.

14. The digital-to-analog converter set forth in claim 10 wherein said internal reference voltage is a peak reference voltage.

15. The digital-to-analog converter set forth in claim 10 wherein said internal reference voltage is a common mode reference voltage.

16. The digital-to-analog converter set forth in claim 14 and further including a common mode reference voltage generator circuit coupled to said power supply sensing circuit, said common mode reference voltage generator circuit having an output which is a common mode reference voltage wherein the magnitude of said common mode reference voltage is one of a plurality of common mode reference voltages, each of said plurality of common mode reference voltages corresponding to one of each of said plurality of voltage ranges received at said first supply voltage input terminal.

17. A method for providing an internal reference voltage in a digital-to-analog converter comprising the steps of:

a) sensing the magnitude of the power supply voltage applied to said digital-to-analog converter;

b) determining which one of a plurality of voltage ranges said power supply voltage falls into to provide a determined voltage range; and c) selecting said internal reference voltage from the one of a like plurality of voltages which corresponds to said determined voltage range.

18. The method for providing an internal reference voltage as set forth in claim 17 wherein said step of sensing the magnitude of the power supply voltage includes the steps of:

a) sensing the application of the power supply voltage to said digital-to-analog converter;

b) generating a reset signal when the application of the power supply voltage is sensed; and c) latching the sensed magnitude of said power supply voltage at the end of said reset signal.

19. A delta-sigma analog-to-digital converter having a peak internal reference voltage generator and a common mode internal reference voltage generator wherein said peak and common mode internal reference voltage generators each select from one of a plurality of predetermined voltages, the said one of a plurality of predetermined voltages being selected by said analog-to-digital converter in response to a power supply voltage applied to the analog-to-digital converter.

20. An analog-to-digital converter having an internal reference voltage wherein said internal reference voltage is selected from one of a plurality of predetermined voltages, the said one of a plurality of predetermined voltages being selected by said analog-to-digital converter in response to a power supply voltage applied to the analog-to-digital converter.

21. An analog-to-digital converter having an internal reference voltage and a first supply voltage input terminal, said analog-to-digital converter comprising:

a) a power supply sensing circuit coupled to said first power supply input terminal, said power supply sensing circuit having an output indicative of one of a plurality of voltage ranges received at said first supply voltage input terminal;

b) a reference voltage generator circuit coupled to said power supply sensing circuit, said reference voltage generator circuit having an output which is said internal reference voltage wherein the magnitude of said internal reference voltage is one of a plurality of reference voltages, each of said plurality of reference voltages corresponding to one of each of said plurality of voltage ranges received at said first supply voltage input terminal.

22. The analog-to-digital converter set forth in claim 21 wherein said power supply sensing circuit further includes:

a) a power on reset circuit for detecting when power is applied to said analog-to-digital converter and for providing a reset signal; and b) a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit.

23. The analog-to-digital converter set forth in claim 21 wherein said plurality of voltage ranges is two voltage ranges.

24. The analog-to-digital converter set forth in claim 21 further including a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit, and wherein said voltage detection circuit, after said detection, holds the detected output signal constant until another reset signal is received.

25. The analog-to-digital converter set forth in claim 21 wherein said internal reference voltage is a peak reference voltage.

26. The analog-to-digital converter set forth in claim 21 wherein said internal reference voltage is a common mode reference voltage.

27. The analog-to-digital converter set forth in claim 25 and further including a common mode reference voltage generator circuit coupled to said power supply sensing circuit, said common mode reference voltage generator circuit having an output which is a common mode reference voltage wherein the magnitude of said common mode reference voltage is one of a plurality of common mode reference voltages, each of said plurality of common mode reference voltages corresponding to one of each of said plurality of voltage ranges received at said first supply voltage input terminal.

28. An analog-to-digital converter having an internal reference voltage and positive and negative supply voltage input terminals, said analog-to-digital converter comprising:

a) a power supply sensing circuit coupled to said positive and negative power supply input terminals, said power supply sensing circuit having an output indicative of one of a plurality of voltage ranges received at said positive and negative supply voltage input terminals;

b) a reference voltage generator circuit coupled to said power supply sensing circuit, said reference voltage generator circuit having an output which is said internal reference voltage wherein the magnitude of said internal reference voltage is one of a plurality of reference voltages, each of said plurality of reference voltages corresponding to one of each of said plurality of voltage ranges received at said positive and negative supply voltage input terminals.

29. The analog-to-digital converter set forth in claim 28 wherein said power supply sensing circuit further includes:

a) a power on reset circuit for detecting when power is applied to said analog-to-digital converter and for providing a reset signal; and b) a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit.

30. The analog-to-digital converter set forth in claim 28 wherein said plurality of voltage ranges is two voltage ranges.

31. The analog-to-digital converter set forth in claim 28 further including a voltage detection circuit for detecting if said first supply voltage input terminal is above or below a predetermined threshold voltage at the end of said reset signal and for providing a detected output signal indicative of said detection, the output of said voltage detection circuit corresponding to said output of said power supply sensing circuit, and wherein said voltage detection circuit, after said detection, holds the detected output signal constant until another reset signal is received.

32. The analog-to-digital converter set forth in claim 28 wherein said internal reference voltage is a peak reference voltage.

33. The analog-to-digital converter set forth in claim 28 wherein said internal reference voltage is a common mode reference voltage.

34. The analog-to-digital converter set forth in claim 32 and further including a common mode reference voltage generator circuit coupled to said power supply sensing circuit, said common mode reference voltage generator circuit having an output which is a common mode reference voltage wherein the magnitude of said common mode reference voltage is one of a plurality of common mode reference voltages, each of said plurality of common mode reference voltages corresponding to one of each of said plurality of voltage ranges received at said first supply voltage input terminal.

35. A method for providing an internal reference voltage in a analog-to-digital converter comprising the steps of:

a) sensing the magnitude of the power supply voltage applied to said analog-to-digital converter;

b) determining which one of a plurality of voltage ranges said power supply voltage falls into to provide a determined voltage range; and c) selecting said internal reference voltage from the one of a like plurality of predetermined voltages which corresponds to said determined voltage range.

36. The method for providing an internal reference voltage as set forth in claim 35 wherein said step of sensing the magnitude of the power supply voltage includes the steps of:

a) sensing the application of the power supply voltage to said analog-to-digital converter;

b) generating a reset signal when the application of the power supply voltage is sensed; and c) latching the sensed magnitude of said power supply voltage at the end of said reset signal.

37. A data conversion device having an internal reference voltage wherein said internal reference voltage is selected from one of a plurality of predetermined voltages, the said one of a plurality of voltages being selected by said data conversion device in response to a power supply predetermined voltage applied to the data conversion device.

* * * * *